(12) United States Patent
Tanaka

(10) Patent No.: US 6,303,463 B1
(45) Date of Patent: Oct. 16, 2001

(54) METHOD FOR FABRICATING A FLAT-CELL SEMICONDUCTOR MEMORY DEVICE

(75) Inventor: Takao Tanaka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/585,923

(22) Filed: Jun. 2, 2000

(30) Foreign Application Priority Data

Jun. 4, 1999 (JP) .................................................. 11-158740

(51) Int. Cl.$^7$ .................................................. H01L 21/76
(52) U.S. Cl. .................... 438/414; 438/418; 438/420; 438/278; 438/262
(58) Field of Search .................. 438/275, 278, 438/262, 265, 414, 418, 420

(56) References Cited

U.S. PATENT DOCUMENTS

| | | | |
|---|---|---|---|
| 5,780,344 | * 7/1998 | Hasegawa | 438/275 |
| 5,893,737 | * 4/1999 | Takahi et al. | 438/275 |
| 6,150,700 | * 11/2000 | Lee | 257/391 |
| 6,204,540 | * 3/2001 | Otsuki | 257/390 |

FOREIGN PATENT DOCUMENTS 2561071    9/1996  (JP) .

* cited by examiner

*Primary Examiner*—Trung Dang
(74) *Attorney, Agent, or Firm*—Hutchins, Wheeler & Dittmar

(57) ABSTRACT

A resist pattern with openings provided at the regions where N$^+$ diffusion layers will be eventually formed is formed on a silicon substrate and thereafter, an N-type impurity is ion-doped to form N$^+$ diffusion layers. Thereafter, gate electrodes are formed via a gate oxide film and then sidewall oxide films are formed, on the semiconductor substrate. Thereafter, an ion implantation of a P-type impurity is performed with a dose two orders of magnitude smaller than that of the N-type impurity for element isolation, with the gate electrodes and the sidewall oxide films being employed as a mask, thereby forming P-type impurity regions. The P-type impurity regions are caused to diffuse due to thermal processing in the following step. However, the element isolating P-type impurity regions resulted from the diffusion diffuse only into immediately under the sidewall oxide films at most, thus preventing the channel width from being narrowed.

10 Claims, 4 Drawing Sheets

METHOD FOR FABRICATING A FLAT-CELL SEMICONDUCTOR MEMORY DEVICE

BACKGROUND OF THE INVENTION

1. Field of the Invention

The present invention relates to a method for fabricating a so-called PN-isolated flat-cell semiconductor memory device. In the device, a conductive impurity of a second type is ion-doped into regions, other than the channel region, between the source and conductive drain diffusion layers of a first type in a cell transistor, thereby isolating the elements.

2. Description of the Related Art

In general, a device of the flat-cell type is available for improving the pattern density of a semiconductor memory device.

In such a ROM (Read Only Memory) of the flat-cell type, an isolation method such as LOCOS (Local Oxidation of Silicon) or trench isolation is not used for element isolation but PN isolation is used therefore. In the PN isolation, an element isolation region is formed by ion-doping a P-type impurity into a region other than the channel region between the N-type diffusion layers in which the source and drain of a cell transistor may be eventually formed.

FIG. 1 is a plan view showing a conventional flat-cell semiconductor memory device. FIGS. 2A to 2C are cross-sectional views showing a method for fabricating the device in the order of the steps to be followed. In these drawings, metal traces are not illustrated. Incidentally, FIGS. 2A to 2C are cross-sectional views taken along line A—A of FIG. 1 (For example, Publication of Japanese Patent No.2561071).

As shown in FIG. 1, a plurality of $N^+$ diffusion layers 111, parallel to one another, which will serve as the source and drain regions of a memory transistor, are formed on a semiconductor substrate. In addition, a plurality of word lines 112 are formed, parallel to one another, orthogonal to and in transverse relation to the $N^+$ diffusion layers 111 via a gate insulating film. P-type impurity regions 115 are formed at regions other than the $N^+$ diffusion layers 111 and those covered with the word lines 112, thereby isolating the memory transistors from one another. Incidentally, the spacing between adjacent $N^+$ diffusion layers 111 is the length of the gate (the channel length) 113 and the width of a word line 112 is the width of the gate (the channel width) 114.

Next, a method for fabricating the memory semiconductor device will be explained. First, an insulating film is formed on a semiconductor substrate 101 and then ion is implanted for threshold control via the insulating film. Thereafter, an N-type impurity is ion-doped into the semiconductor substrate 101 to form the $N^+$ diffusion layers 111 by employing a photo resist as a mask with openings provided for the regions in which the $N^+$ diffusion layers 111 shown in FIG. 1 will be eventually formed.

Then, as shown in FIG. 2A, a gate oxide film 102 is formed on the semiconductor substrate 101. Moreover, a polysilicon layer is formed on the gate oxide film 102. Then, a resist pattern is formed on the polysilicon layer by photolithography and etching is performed using the photo resist pattern as a mask, thereby forming gate electrodes 103 which will eventually serve as the word lines 112.

Then, as shown in FIG. 2B, a P-type impurity 104 is ion-doped into the entire surface for the purpose of element isolation. At this time, the P-type impurity 104 is ion-doped into the $N^+$ diffusion layers 111. However, the dose of the $N^+$ diffusion layers 111 is about two orders of magnitude greater than that of the ion implantation of the P-type impurity for element isolation. Therefore, the $N^+$ diffusion layers 111 remain as N-type layers. Thus, only the regions where the word lines 112 are not formed become P-type impurity regions 105, except the $N^+$ diffusion layers 111. That is, this technique provides element isolation for the $N^+$ diffusion layers 111 and the word lines 112 by self-alignment.

Next, as shown in FIG. 2C, thermal processing performed to activate the P-type impurity causes the P-type impurity regions to diffuse to turn the P-type impurity regions 105 into element isolating P-type impurity regions 105a. A memory semiconductor device fabricated as such has the word lines and the bit lines made up of diffusion layers in transverse relation to each other. This eliminates the need to provide each of the bit lines with contacts for metallization, thereby improving the pattern density.

However, according to this conventional method for fabricating a semiconductor memory device, the ion implantation of the P-type impurity 104 for element isolation is performed immediately after the formation of the word lines that serve also as the gate electrodes. Accordingly, as shown in FIG. 2C, thermal processing performed to activate the P-type impurity ions causes the element isolating P-type impurity regions 105a to diffuse so as to narrow the spacing between adjacent regions. That is, this presents a problem that the regions diffuse to narrow the effective channel width (the gate width) in the flat cell, thereby reducing cell currents.

In addition, this presents another problem that reducing the dose of the P-type impurity ions to ensure cell currents causes leak currents between the diffusion layers to increase to provide a narrowed margin of circuit operation.

SUMMARY OF THE INVENTION

It is an object of the present invention to provide a method for fabricating a flat-cell memory semiconductor device capable of preventing cell currents from being reduced and ensuring a sufficiently high dose of an ion implantation for element isolation to reduce leakage between diffusion layers.

A method for fabricating a flat-cell semiconductor memory device according to one aspect of the present invention comprises the steps of: forming a plurality of stripe-shaped source and drain diffusion layers of a second conductive type, parallel to one another, on a surface of a semiconductor substrate of a first conductive type; forming a plurality of stripe-shaped word lines comprising gate electrodes and gate insulating films, parallel to one another, in transverse relation to said source and drain diffusion layers; forming sidewall insulating films on the sides of said word lines; performing an ion implantation of an impurity of the first conductive type for element isolation with said word lines and sidewall insulating films being employed as a mask; and activating said impurity of the first conductive type by thermal processing.

According to another aspect of the present invention, a method for fabricating a flat-cell semiconductor memory device comprises the steps of: implanting ions for threshold control of memory transistors into a semiconductor substrate of a first conductive type via a first insulating film on said semiconductor substrate; forming a plurality of stripe-shaped source and drain diffusion layers of a second conductive type, by an ion implantation of an impurity of the second conductive type via said first insulating film; forming a second insulating film and a conductive layer after said first insulating film is removed; forming a plurality of stripe-shaped word lines comprising gate electrodes and gate insulating films, parallel to one another, in transverse relation to said diffusion layers, by patterning said conductive layer and the second insulating film; forming sidewall insulating films on the sides of said word lines; forming a third insulating film on the entire surface of said semiconductor substrate; performing an ion implantation of an impurity of the first conductive type for element isolation into said semiconductor substrate via said third insulating film with said word lines and said sidewall insulating films being employed as a mask; and activating said impurity of the first conductive type by thermal processing.

Furthermore, said conductive layer may comprise a lower layer, made of polysilicon, in which a high concentration of impurity is diffused, and an upper layer made of silicide.

Furthermore, a dose of an implantation of impurity ions of said second conductive type for forming said source and drain diffusion layers is preferably two orders of magnitude greater than that of an implantation of impurity ions of said first conductive type for element isolation.

Still furthermore, said sidewall insulating film can be a silicon oxide film or a silicon nitride film.

Furthermore, said sidewall insulating film can be formed in a manner such that an insulating film is formed 50 to 200nm in thickness on the entire surface and thereafter the insulating film is etched back.

In the present inventions, the word lines, which serves also as the gate electrode, and sidewalls are formed on memory cells that are formed on a semiconductor substrate of a first conductive type. Thereafter, an ion implantation of an impurity of the first conductive type is performed for element isolation with them employed as a mask. This prevents the gate width in the channel from being narrowed. This is because even when the impurity of the first conductive type diffuses in such directions as to narrow the gate width of the memory cells due to the thermal processing in the following step, the diffusion is limited to within the sidewall regions at most. This enables insuring a sufficiently large memory cell current, and a necessary and sufficient dose for ion implantation of the first conductive type impurity required for PN isolation, thereby enabling the prevention of cell leak currents.

The nature, principle, and utility of the invention will become more apparent from the following detailed description when read in conjunction with the accompanying drawings in which like parts are designated by like reference numerals.

DETAILED DESCRIPTION OF THE PREFERRED EMBODIMENT

Figure 1:
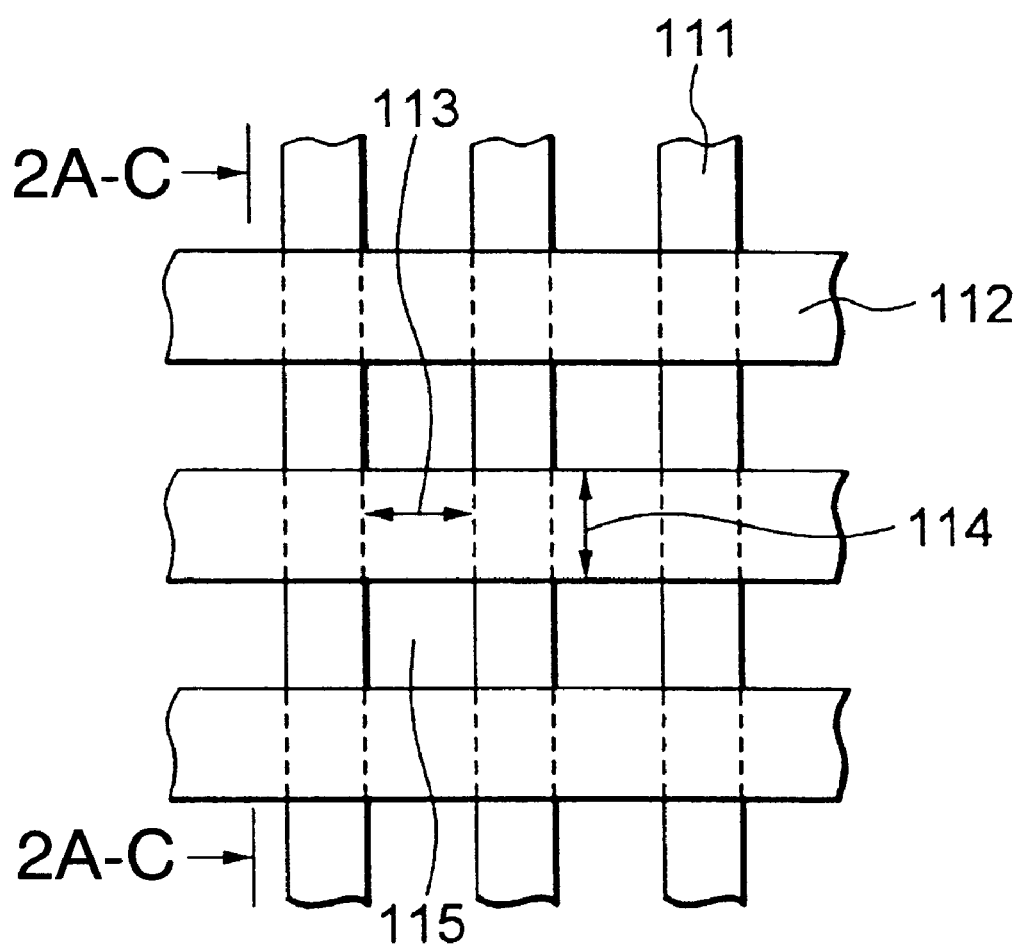
FIG. 1 is a plan view showing the semiconductor memory device described in Publication of Japanese Patent No.2561071.
Figure 2A:
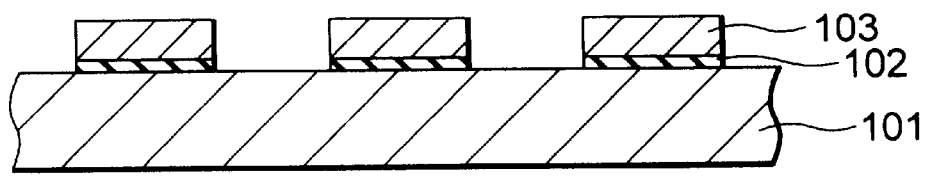
FIGS. 2A to 2C are cross-sectional views taken along line A—A of FIG. 1, showing a method for fabricating the semiconductor memory device in the order of the steps employed.
Figure 2B:
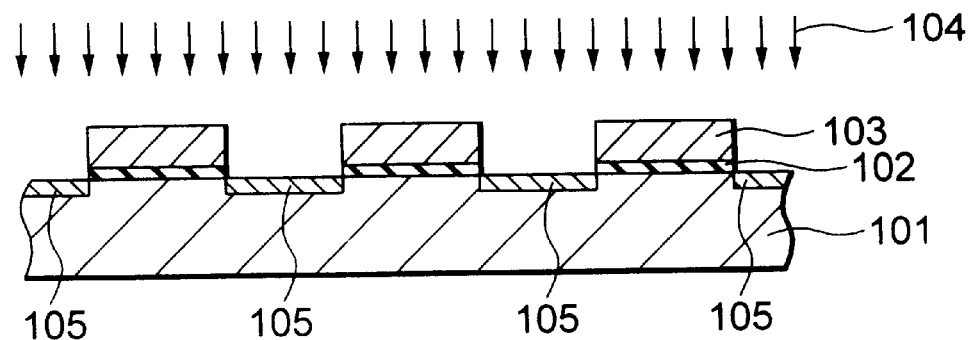
Figure 2C:
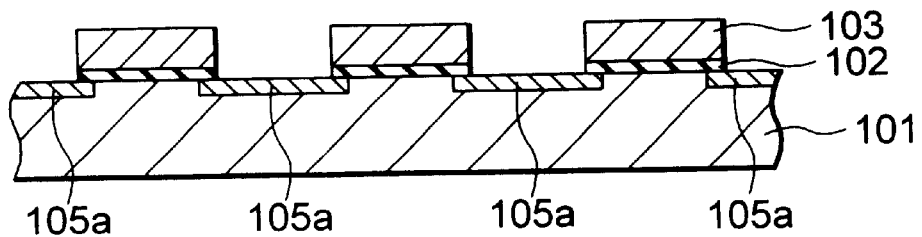
Figure 3:
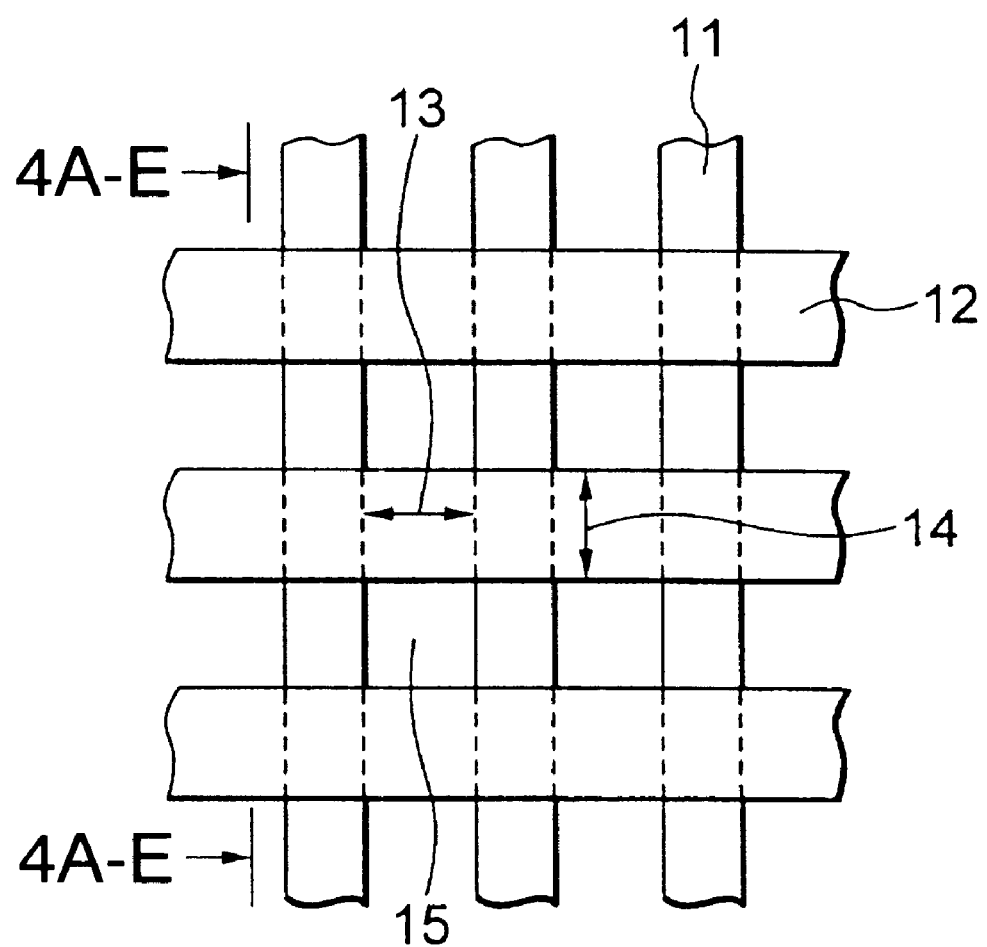
FIG. 3 is a plan view showing a flat-cell memory device according to the embodiment of the present invention.

A method for fabricating a flat-cell semiconductor memory device according to the embodiment of the present invention will be explained below specifically with reference to the accompanying drawings. FIG. 3 is a plan view showing a flat-cell portion of the flat-cell semiconductor memory device according to the embodiment of the present invention. In these drawing, metal traces are not illustrated.

As shown in FIG. 3, on a surface of a semiconductor substrate, memory cells of the flat-cell type have a plurality of stripe-shaped $N^+$ diffusion layers 11, which will serve as the source and drain regions of a memory transistor, arranged alternately and parallel to one another. A plurality of word lines 12 are formed, parallel to one another, orthogonal to and in transverse relation to the $N^+$ diffusion layers 11. In addition, a P-type impurity regions 15 are formed at regions other than the $N^+$ diffusion layers 11 and those covered with the word lines 12, thereby isolating the memory transistors from one another. The P-type impurity regions 15 are formed to isolate memory cells from one another in the regions except the $N^+$ diffusion layers 11 and the word lines 12 in the self-alignment manner. In this configuration, the length of the gate (the channel length) 13 of the memory transistor is the spacing between adjacent $N^+$ diffusion layers 11 and the width of a word line 12 is the width of the gate (the channel width) 14.

Next, a method for fabricating memory cells of this flat-cell type will be explained. FIGS. 4A to 4E are cross-sectional views taken along line B—B of FIG. 3, showing the method for fabricating the flat-cell memory cells in the order of the steps employed.

Figure 4A:
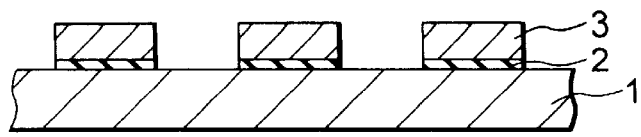
FIGS. 4A to 4E are cross-sectional views taken along line B—B of FIG. 3, showing a method for fabricating flat-cell memory cells in the order of the steps employed.

First, an oxide film (not shown) is formed 5 to 20 nm in thickness on a P-type silicon substrate 1 and then ion is implanted for threshold control of the memory cell transistor. Then, using a photo resist (not shown), a resist pattern is formed which has openings provided for the regions in which the $N^+$ diffusion layers 11 shown in FIG. 3 will be eventually formed. Thereafter, an ion implantation is performed with energies of 40 to 70 keV and doses of $7 \times 10^{14}$ to $3 \times 10^{15} cm^{-2}$ to form the $N^+$ diffusion layers 11 shown in FIG. 3. Thereafter, the photo resist and the oxide film are removed to form an oxide film 5 to 15 nm in thickness, which will serve as a gate oxide film 2. A polysilicon film is deposited 100 to 200 nm in thickness by the CVD method on this oxide film and then phosphorus is diffused thereto in large concentrations. Furthermore, a silicide film composed of a metal having a high-melting point such as molybdenum (Mo), tungsten (W), and titanium (Ti) is deposited 100 to 200 nm in thickness by sputtering on the polysilicon film. Then, a photo resist pattern is formed to etch said high-melting metal silicide film and said polysilicon film by the reactive ion etching. Thus, gate electrodes 3 are formed which will serve as the word lines 12. FIG. 4A shows a cross-sectional view in a direction orthogonal to the longitudinal direction of the word lines 12.

Figure 4B:
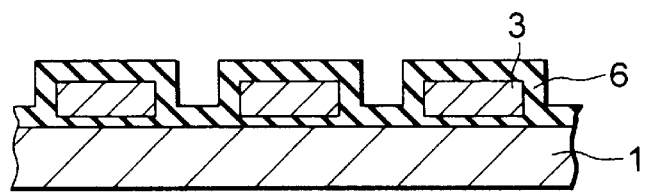

Then, as shown in FIG. 4B, an oxide film 6 is formed 50 to 200 nm in thickness by the CVD method. The oxide film 6 includes, for example, a silicon oxide film, and an electrically insulating material such as a silicon nitride film can be used.

Figure 4C:
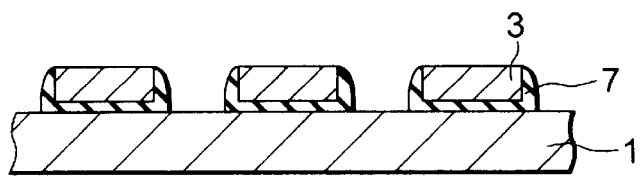

Then, as shown in FIG. 4C, the entire surface is etched back to form sidewall oxide films 7 on the sides of the gate electrodes 3 (word lines 12).

Figure 4D:
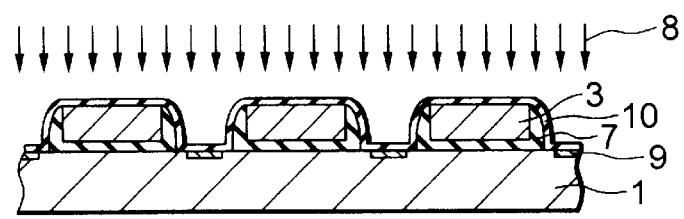

Then, as shown in FIG. 4D, an oxide film 10 is deposited 10 to 30 nm in thickness by the CVD method and then an ion implantation of a P-type impurity 8 is performed into the entire surface. For example, boron or boron fluoride can be used as the seed of the P-type impurity 8. For example, in the case of using boron, energies of 20 to 30 keV and doses of $5\times10^{12}$ to $3\times10^{13} cm^{-2}$ can be used as the ion implanting conditions. This ion implantation is performed for element isolation of memory cells, in the case of which ions are implanted in the self-alignment manner with the word lines 12 and the sidewall oxide films 7 being employed as the mask. At this time, the P-type impurity is also implanted into the $N^+$ diffusion layers 11. However, the dose of the ion implantation for forming the $N^+$ diffusion layers is about two orders of magnitude greater than that of the implantation of the P-type impurity for element isolation. Thus, the $N^+$ diffusion layers 11 would never be turned into P-type layers due to the difference in concentration. Therefore, P-type impurity regions 9 are formed in regions except the word lines 12, the sidewall oxide films 7, and the $N^+$ diffusion layers 11.

Figure 4E:
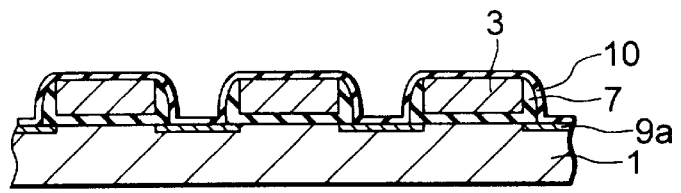

Then, as shown in FIG. 4E, thermal processing is performed in a nitrogen atmosphere for about 10 to 30 minutes at temperatures of 800 to 900° C. in order to activate the ion-doped P-type impurity. At this time, the P-type impurity regions 9 diffuse into such directions as to narrow the gate width 14 of the memory cells due to the thermal diffusion of the impurity to form element isolating P-type impurity regions 9a. In the present invention, after forming the sidewall oxide films 7, the element isolating P-type impurity regions 9a are formed by the ion implantation of the P-type impurity 8 using the sidewall oxide films 7 as the mask. For this reason, the width of the P-type impurity regions 9 is originally narrower by that of the sidewall oxide films 7. Therefore, this prevents the element isolating P-type impurity regions 9a from diffusing to immediately under the channels of the memory cells even when the P-type impurity diffuses due to the thermal processing.

Incidentally, in this embodiment, the first conductive type region is formed as a P-type and the second conductive type region as an N type, however, the first conductive type region may also be formed as an N type and the second conductive type as a P type.

According to this embodiment, the ion implantation of the P-type impurity 8 for element isolation of cell regions in a flat-cell ROM is performed after the formation of the sidewall oxide films 7 of the poly-side gate electrodes 3, which are used as the word lines 12. This prevents the gate width in the channel from being narrowed. This is because even when the P-type impurity diffuses in such directions as to narrow the gate width of the memory cells due to the thermal processing in the following step after the ion implantation, the diffusion is limited to within the sidewall regions at most. Thus, the element isolating P-type impurity regions 9a can be prevented from diffusing to immediately under the channels in the cell regions. Accordingly, this prevents the element isolating P-type impurity regions 9a from reducing cell currents ("on" currents for the cell transistors). That is, sufficiently large memory cell currents can be made available.

Furthermore, sufficient cell currents can be made available even when the P-type impurity regions 9 are activated into element isolating P-type impurity regions 9a. Accordingly, a necessary and sufficient dose of P-type impurity ions required for element isolation (PN isolation) in the cell regions can be ensured, thus enabling the prevention of cell leak currents.

In conventional processes, the ion implantation of a p-type impurity was performed immediately after the formation of a conductive layer. Accordingly, reducing the dose of the P-type impurity for element isolation of memory cells in order to ensure memory cell currents would result in an increase in leakage between N-type diffusion layers of memory cells, thus narrowing the circuit operation margin. Conversely, increasing the dose of the doped P-type impurity in order to make the leakage between the N-type diffusion layers smaller would result in a decrease in cell current, thus reducing the read-out speed of the memory cells. The present invention can solve these drawbacks, and improve the stability of the circuit operation and variations in process.

As described above, according to the present invention, a conductive layer, which serves also as the gate electrode, and sidewalls are formed on memory cells that are formed on a semiconductor substrate of a first conductive type. Thereafter, an ion implantation of an impurity of the first conductive type is performed for element isolation with them employed as a mask. This prevents the gate width in the channel from being narrowed. This is because even when the impurity of the first conductive type diffuses in such directions as to narrow the gate width of the memory cells due to the thermal processing in the following step, the diffusion is limited to within the sidewall regions at most. This enables insuring a sufficiently large memory cell current, and a necessary and sufficient dose for ion implantation of the first conductive type impurity required for PN isolation, thereby enabling the prevention of cell leak currents.

While there has been described what is at present considered to be a preferred embodiment of the invention, it will be understood that various modifications may be made thereto, and it is intended that the appended claims cover all such modifications as fall within the true spirit and scope of the invention.

What is claimed is:

1. A method for fabricating a flat-cell semiconductor memory device, comprising the steps of:

forming a plurality of stripe-shaped source and drain diffusion layers of a second conductive type, parallel to one another, on a surface of a semiconductor substrate of a first conductive type, forming a plurality of stripe-shaped word lines comprising gate electrodes and gate insulating films, parallel to one another, in transverse relation to said source and drain diffusion layers, forming sidewall insulating films on the sides of said word lines, performing an ion implantation of an impurity of the first conductive type for element isolation with said word lines and sidewall insulating films being employed as a mask, and activating said impurity of the first conductive type by thermal processing.

2. A method for fabricating a flat-cell semiconductor memory device, comprising the steps of:

implanting ions for threshold control of memory transistors into a semiconductor substrate of a first conductive type via a first insulating film on said semiconductor substrate, forming a plurality of stripe-shaped source and drain diffusion layers of a second conductive type, by an ion implantation of an impurity of the second conductive type via said first insulating film, forming a second insulating film and a conductive layer after said first insulating film is removed, forming a plurality of stripe-shaped word lines comprising gate electrodes and gate insulating films, parallel to one another, in transverse relation to said diffusion layers, by patterning said conductive layer and the second insulating film, forming sidewall insulating films on the sides of said word lines, forming a third insulating film on the entire surface of said semiconductor substrate, performing an ion implantation of an impurity of the first conductive type for element isolation into said semiconductor substrate via said third insulating film with said word lines and said sidewall insulating films being employed as a mask, and activating said impurity of the first conductive type by thermal processing.

3. The method for fabricating a flat-cell semiconductor memory device according to claim 1, wherein said conductive layer comprises a lower layer, made of polysilicon, in which a high concentration of impurity is diffused, and an upper layer made of silicide.

4. The method for fabricating a flat-cell semiconductor memory device according to claim 1, wherein a dose of an implantation of the impurity ions of the second conductive type for forming said source and drain diffusion layers of the second conductive type is two orders of magnitude greater than that of an implantation of the impurity ions of the first conductive type for element isolation.

5. The method for fabricating a flat-cell semiconductor memory device according to claim 1, wherein said sidewall insulating film is a film selected from the group consisting of a silicon oxide film and a silicon nitride film.

6. The method for fabricating a flat-cell semiconductor memory device according to claim 1, wherein said sidewall insulating film is formed by the steps of:
 forming an insulating film 50 to 200 nm in thickness on the entire surface, and
 etching back said insulating film.

7. The method for fabricating a flat-cell semiconductor memory device according to claim 2, wherein said conductive layer comprises a lower layer, made of polysilicon, in which a high concentration of impurity is diffused, and an upper layer made of silicide.

8. The method for fabricating a flat-cell semiconductor memory device according to claim 2, wherein a dose of an implantation of the impurity ions of the second conductive type for forming said source and drain diffusion layers of the second conductive type is two orders of magnitude greater than that of an implantation of the impurity ions of the first conductive type for element isolation.

9. The method for fabricating a flat-cell semiconductor memory device according to claim 2, wherein said sidewall insulating film is a film selected from the group consisting of a silicon oxide film and a silicon nitride film.

10. The method for fabricating a flat-cell semiconductor memory device according to claim 2, wherein said sidewall insulating film is formed by the steps of:
 forming an insulating film 50 to 200 nm in thickness on the entire surface, and
 etching back said insulating film.

* * * * *